United States Patent [19]

Knüttel et al.

[11] Patent Number: 4,748,414
[45] Date of Patent: May 31, 1988

[54] NUCLEAR SPIN TOMOGRAPH

[75] Inventors: Bertold Knüttel, Rheinstetten; Günther R. Laukien, Rheinstetten-Forchheim, both of Fed. Rep. of Germany

[73] Assignee: Bruker Medizintechnik GmbH, Fed. Rep. of Germany

[21] Appl. No.: 835,865
[22] PCT Filed: May 15, 1985
[86] PCT No.: PCT/DE85/00164
§ 371 Date: Jan. 17, 1986
§ 102(e) Date: Jan. 17, 1986
[87] PCT Pub. No.: WO85/05448
PCT Pub. Date: Dec. 5, 1985

[30] Foreign Application Priority Data

May 19, 1984 [DE] Fed. Rep. of Germany ....... 3418812

[51] Int. Cl.$^4$ .............................................. G01R 33/20
[52] U.S. Cl. ..................................... 324/318; 324/319; 335/296
[58] Field of Search ............... 324/318, 319, 320, 307, 324/309; 335/296, 297, 299, 301, 304

[56] References Cited

U.S. PATENT DOCUMENTS

| | | | |
|---|---|---|---|
| 3,345,523 | 10/1967 | Grünwald | 310/11 |
| 3,513,422 | 5/1970 | Watson et al. | 335/296 |
| 3,789,832 | 5/1974 | Damadian | 128/2 R |
| 4,038,622 | 7/1977 | Purcell | 335/229 X |
| 4,318,043 | 3/1982 | Crooks et al. | 324/309 |
| 4,354,499 | 10/1982 | Damadian | 128/683 |
| 4,411,270 | 10/1983 | Damadian | 128/653 |
| 4,442,404 | 4/1984 | Bergmann | 324/309 |
| 4,456,881 | 6/1984 | Compton | 324/319 |
| 4,490,675 | 12/1984 | Knuettet et al. | 324/318 |
| 4,613,820 | 9/1986 | Edelstein et al. | 324/318 |

FOREIGN PATENT DOCUMENTS 2551258 3/1985 France .

OTHER PUBLICATIONS

P. Hanley, Superconducting . . . NMR Scanning, Proceedings on NMR Imaging at Bowman Gray School of Medicine, Oct. 1-3, 1981.
G. Parzen, "Magnetic Fields for Transporting Charged Beams," Brookhaven National Laboratory BNL-50536 (Jan. 1976).
C.-M. Lai et al., Electro/78 Boston, Mass. pp. 30/2:1-15 (May 23-25, 1978).

Primary Examiner—Michael J. Tokar
Attorney, Agent, or Firm—Pennie & Edmonds

[57] ABSTRACT

A nuclear spin tomograph comprises a magnet system with a, preferably, elongated holder (19,20) for a test object arranged in its one axis to slide in the longitudinal direction. The test object is further surrounded by coil systems for generating gradient fields and for irradiating a radio-frequency field. The magnet system is provided with a yoke iron body (10) enclosing a longitudinal opening (11) for receiving the test object, with outer marginal areas of the longitudinal opening (11) accommodating coil sections (12, 12'; 13, 13') which extend in the direction of the longitudinal opening (11), which are bent over at the ends thereof and which close above the opening (11) (FIG. 1).

14 Claims, 2 Drawing Sheets

NUCLEAR SPIN TOMOGRAPH

TECHNICAL FIELD

The present invention proceeds from a nuclear spin tomograph comprising a magnet system with a, preferably, elongated holder for a test object arranged in its one axis to slide in a longitudinal direction, the test object being further surrounded by coil systems. for generating gradient fields and for irradiating a radio-frequency field.

BACKGROUND ART

A nuclear spin tomograph in which a human body is positioned within an electromagnetic system which may comprise ferromagnetic parts, has been known already from German Disclosure Document No. 28 54 774. According to this arrangement, however, the patient is surrounded on all sides, at least during the measurement, by magnetic coils and electromagnetic bodies of an unspecified type, so that it is not apparent how the patient is to be introduced into the test space and how exactly the coils for generating the magnetic field are to be arranged. This makes the magnetic system of the known arrangement absolutely unsuited for practical use because there is no opening through which the test object can be introduced and because in addition it requires magnet dimensions which, for reasons of weight, rule out their realization as iron magnets.

The term nuclear spin tomography or NMR tomography is understood to describe a method in which a test object, in particular a live human body or animal body is subjected simultaneously to a strong homogenous magnetic field and an r.f. field directed perpendicularly thereto. At the same time, one generates in the area of the test object a gradient field acting in the same direction as the homogenous magnetic field and decreasing in strength in the axis of the test object. Now, when the r.f. field is applied, nuclear magnetic resonance occurs only in the area of one plane of the test object because, due to the active gradient field, the magnetic field has a strength which, given the gyromagnetic ratio of protons, corresponds to the frequency of the irradiated r.f. field only in the area of this same plane. This makes it possible to produce sectional images of the test object.

In order to obtain sufficient measuring signals, it is necessary to work at relatively high magnetic field strengths. Known nuclear spin tomographs operate, for example, at a magnetic field having a strength of 0.23 Tesla.

On the other hand, relatively large sample spaces are required to permit, for example, measurement on human bodies. This is the reason why one has used to this day mainly magnetic systems using air-cored coils which were operated either in the normally conductive or in the superconductive operating mode. However, such air-cored coils have quite a number of drawbacks.

Firstly, the extreme homogeneity of the magnetic field required in the sample space is impaired already by minor disturbing factors occurring outside the magnetic system. Such disturbing factors may be either of a stationary nature, as for example reinforcing steel in the walls of the room in which the nuclear spin tomograph is installed, or else of a moving type, such as instrument trolleys moved in the neighborhood of the tomograph or even cars passing outside the examination building.

Secondly, air-cored coils give rise to a considerable leakage field since the homogenous magnetic field extending along the axis of the air-cored coil closes via the external space of the air-cored coil. This leakage field of the air-cored coil may influence equipment placed near the magnet system, such as electronic equipment, data processing systems or radiological equipment in a hospital. In addition, the leakage field may also disturb the operation of pacemakers so that it may be connected with certain risks for pacemaker patients to stay near the magnet system.

In an effort to overcome these disadvantages, a known system described in German Disclosure Document No. 31 23 493 has been provided with a shielding of a soft-magnetic material which absorbs the largest part of the leakage field. But due to the solenoid design of the air-cored coil, in which the direction of the constant magnetic field coincides with the coil axis, a considerable portion of the leakage field is still permitted to leak out through the opening which is required for introducing the test object.

In addition to these disadvantages relating to the leakage field, magnet systems using air-cored coil arrangements in the form of Helmholtz arrangements or of solenoids are connected with still another disadvantage resulting from the coil geometry.

As mentioned before, the constant magnetic field extends in the case of these coils along the direction of the coil axis and, thus, also the longitudinal axis of the patient. The coils required for irradiating the r.f. field therefore have to be of the saddle-shaped type as the r.f. field must extend perpendicularly to the constant magnetic field. However, these saddle-shaped r.f. coils, which serve not only for radiating the r.f. field, but also for receiving the measuring signal, have a relatively poor efficiency which in practice is lower by the factor 2.5 than the one that can be achieved with the aid of an r.f. transmitting and receiving coil in the form of a solenoid.

Finally, normally conductive air-cored systems offer the known disadvantage that the conversion ratio, i.e. the ratio between the achieved field strength and the consumed electric energy, is relatively poor so that large power supplies with a considerable energy consumption are required for feeding such normally conductive air-cored coil systems.

In assessing the value of the present invention, it should further be noted as an important aspect that the standard works in the field of nuclear spin tomography describes the use of electromagnets or measurements on human bodies as not feasible for reasons of dimension (e.g. Electro/78 Conference Record, May 23 to 25, 1978, pages 30/21-15, Boston, USA). This is affirmed also by the nuclear spin tomographs presently available on the market with use exclusively air-cored arrangements. Hence, it is the credit of the present invention that it was the first to overcome this prejudice and to indicate a way of implementing a nuclear spin tomograph for measurement on human bodies using an iron magnet.

Now, it is the object of the present invention to improve nuclear spin tomographs of the type described above so that any magnetic disturbing factors acting from the outside to the inside, or from the inside to the outside, are minimized; that r.f. coil arrangements of high efficiency can be used; and that relatively little electric power has to be employed to achieve high field strength, while maintaining on the other hand the full advantages of the known devices, in particular its ease of access to the test space.

DISCLOSURE OF THE INVENTION

According to the invention, this object is achieved by an arrangement in which the magnet system is provided with a yoke iron body enclosing a longitudinal opening for receiving the test object, with outer marginal areas of the longitudinal opening accommodating coil sections which extend in the direction of the longitudinal opening, which are bent over at the ends thereof and which close above the opening.

Thus, the tomograph according to the invention offers the advantage that any magnetic disturbing factors acting from the outside to the inside or from the inside to the outside are largely suppressed by the use of an iron body which is closed almost all round and in which the magnetic field closes passing only an air space which is intended for receiving the test object and which is enclosed by the iron body over the whole longitudinal area. The constant magnetic field present in the air space is delimited by level iron faces so that solenoid-shapped r.f. coil arrangements may be used which permit an improved signal yield to be achieved. Finally, the ferromagnetic system employed according to the invention permits the use of power supplies of a lower rating as systems of this type are generally known to achieve higher field strengths with lower energy consumption.

In a particularly preferred embodiment of the invention, one pair of coil sections is arranged in each corner of the longitudinal opening which exhibits a rectangular cross-sectional shape. This arrangement facilitates the process of winding the necessary coils and in particular bending over the coils in the area of the outer openings. On the other hand, a rectangular cross-sectional shape of the longitudinal opening provides already good basic homogeneity of the magnetic field, without the use of any additional aids. And finally, such a longitudinal opening also facilitates the use of displaceable stretchers for the patients to be examined.

A particularly favorable effect is achieved in this arrangement when the described coil sections can be displaced, preferably in two directions perpendicular to the axis of the longitudinal opening. The possibility to displace the coil sections in this manner provides a very simple means of improving the homogeneity of the magnetic field.

A further improvement of the homogeneity of the field can be achieved according to the invention by arranging longitudinal shims in the form of ferromagnetic sections in the longitudinal opening, for field correction. These sections may be arranged either in the marginal area of the opening to compensate for marginal field losses, or else in the middle of the opening to compensate for a possible field drop in the central area.

Suitable homogenization of the magnetic field is further possible by arranging in the inner marginal area of the iron body a soft-magnetic plate which delimits the longitudinal opening and which can be displaced, by means of suitable adjusting means, in at least one direction perpendicular to the axis of the longitudinal opening. Particularly sensitive means for adjusting the homogeneity of the field are obtained, for example, by the use of a spindle.

Although the occurrence of leakage fields is already reduced to a minimum thanks to the magnet system used according to the invention, a further compensation of the residual field can be achieved preferably by an arrangement in which the iron body is provided with soft-magnetic cover plates closing the longitudinal opening, leaving open substantially only the area through which the coil sections project outwardly and, preferably, an opening for the introduction of the test object, and extending a certain way into the marginal area of the iron body adjacent the longitudinal opening. By providing such cover plates, the resulting iron body is closed practically all round so that any disturbing factors acting from the outside to the inside or from the inside to the outside are practically completely suppressed.

Finally, the magnet system used may, according to a further improvement of the invention, be arranged in such a manner that the test object, in particular a patient, can be introduced into the magnet system in horizontal position; it is, however, also possible to provide the magnet system in upright arrangement, i.e. with its axis extending in the vertical direction relative to the surrounding space, so that the patient can be examined either standing or in seated position.

BRIEF DESCRIPTION OF THE DRAWINGS

Further advantages of the present invention will become apparent from the specification and the attached drawing.

The invention will now be described in detail with reference to the drawing in which.

BEST MODE FOR CARRYING OUT THE INVENTION

Figure 1:
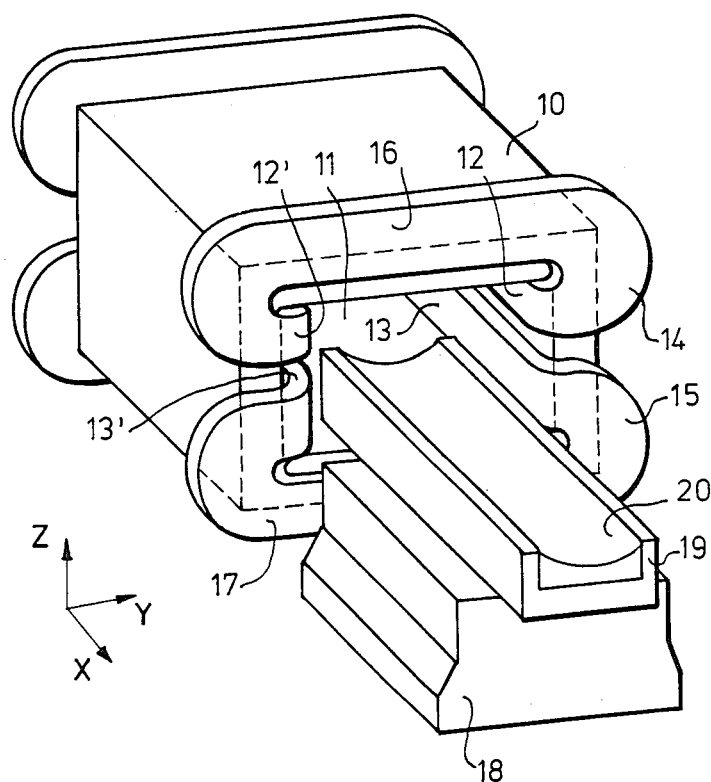
FIG. 1 is a perspective view of part of one embodiment of a nuclear spin tomograph according to the invention.

In the perspective view of FIG. 1, an iron body 10 of cuboid shape comprises a full-length coaxial longitudinal opening 11 of rectangular cross-section. The axis of the longitudinal opening 11 is designated by the letter x, the axes extending vertically thereto are designated by z and y. The axes x and y extend in the horizontal, the axis z in the vertical direction, relative to the surrounding space. However, this is the case only in the embodiment shown in FIG. 1, it being of course also possible to orient the arrangement of FIG. 1 differently, for example in such a manner that the axis x extends vertically relative to the surrounding space so that a patient can be examined in standing or seated position, as described in detail in the before-mentioned German Disclosure Document No. 31 23 493.

The longitudinal opening 11 contains a total of four coil sections, with flat coils 12 and 12' extending in the upper corners of the rectangular longitudinal opening 11, and flat coils 13 and 13' extending in the lower corners. In the areas where the flat coils project from the longitudinal opening 11 of the iron body 10, the flat coils 12 and 13 are bent off at the points 14 and 15 initially by 90° in the y direction and then upwardly by 180° in the z direction, extending thereafter along the end faces 16 and 17 in y direction to joint the coil sections 12' and 13'. On the opposite end face of the iron body 10, the flat coils are provided in corresponding arrangement.

The described arrangement is to be understood only as an example. It goes without saying that only a single pair of coils or a greater number of pairs of coils may be used instead of the two pairs of coils 12, 12' and 13, 13' shown in FIG. 1. In addition, the coil section 12 projecting from the opening may, for example, be bent off initially by 90° in the upward direction and then bent over by 90° in the y direction.

Outside the iron body 10, a support 18 can be seen carrying guide means 19 for a stretcher 20. The stretcher 20 serves for receiving a test object, for example a patient, and can be moved in the x direction into the longitudinal opening 11.

For greater simplicity and clarity, neither the coil arrangements for generating the gradient fields and the r.f. field, nor the electronic equipment required for processing the data and displaying the sectional images have been shown in FIG. 1. However, these units are known as such so that there is no need to describe them once more in detail in the context of the present patent application.

Figure 2:
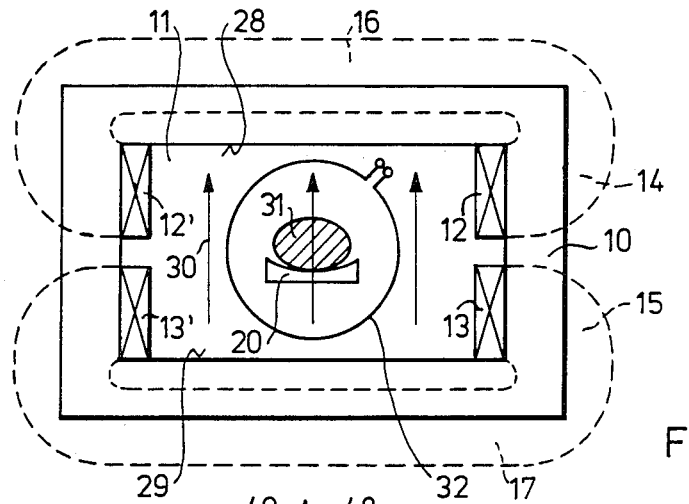
FIG. 2 is a diagrammatic front view of a magnet system employed according to the invention.

FIG. 2 is a simplified front view of the representation according to FIG. 1 showing again the iron body 10 containing the longitudinal opening 11 and the pairs of coils 12, 12' and 13, 13' closing in the manner described above via the portions 14, 15, 16, 17.

The before-mentioned coils generate a magnetic field extending very homogenously over the space of the longitudinal opening 11 between cover faces 28 and 29 and closing on the outside via the side walls of the iron body 10. This constant magnetic field generated by the coil system 12, 13 is indicated in FIG. 2 by reference numeral 30. It passes the test object 31 arranged on the stretcher 20 in the manner indicated in the drawing, i.e. a patient stretched out on the stretcher 20 in an axis extending vertically relative to his longitudinal axis. An r.f. coil 32 provided for irradiating the required r.f. field lays a plane in the z y direction in the embodiment shown in FIG. 2. It is, however, understood that contrary to the representation shown in FIG. 2, the coil 32 may also be arranged in a position rotated by 90° in which case it would lay a plane in the z x direction.

Figure 3:
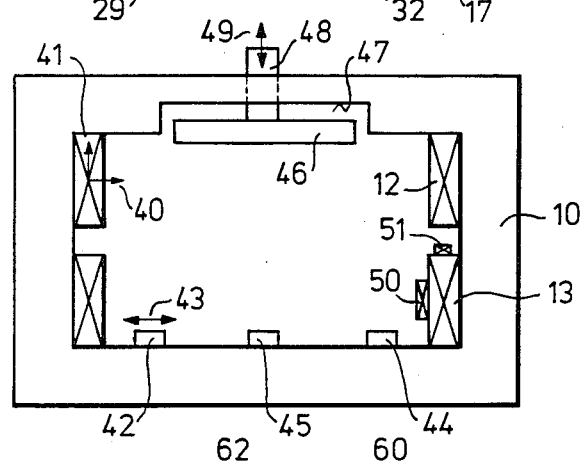
FIG. 3 is a view corresponding to FIG. 2, showing different means for correcting the magnetic field.

In the representation shown in FIG. 3, which corresponds to the view of FIG. 2, individual means for correcting the magnetic field are indicated.

Firstly, the coils 12, 12', 13, 13' may be arranged for displacement in the directions 40, 41, i.e. in the y and z directions. It is, however, also possible to provide so-called longitudinal shims 42, 44, 45 substantially in the form of ferromagnetic sections, preferably rectangular sections, extending in the x direction in the longitudinal opening 11. These shims 42, 44, 45 may be displaceable in a direction 43, i.e. in the y direction. If it is found, for example, that the field profile along the y axis of the constant magnetic field 30 shows a convex shape with dropping flanks, it will be convenient to arrange longitudinal shims 42 and 44 in the marginal area to increase the field strength exactly in this marginal area so as to compensate the field drop encountered without such shims. If, in contrast, it is found that the field profile in the y direction drops in the central portion, it will be convenient to provide a centrally arranged longitudinal shim 45 increasing the field strength in the central portion and compensating thereby the central drop.

In an effort to increase the field homogeneity still further, one may additionally provide a soft iron plate 46 extending in the axial direction of the longitudinal opening 11. The soft iron plate 46 is received in a recess 47 in the top face 28 or the bottom face 29 and can be displaced in a direction 49 along the z axis, for example by means of a spindle indicated at 48.

Finally, the coils 12, 13 may also be provided with correction coils 50, 51 which are superimposed upon the coils 12, 13 in the z or the y direction.

As can be seen in FIG. 2, the inner space is already largely shielded due to the particular structure of the iron body 10 which encloses the longitudinal opening 11 almost completely, so that on the one hand no disturbing factors are permitted to penetrate from the outside to the inside while on the other hand no leakage fields emanating from the magnet system can influence any equipment outside the magnetic system.

Figure 4:
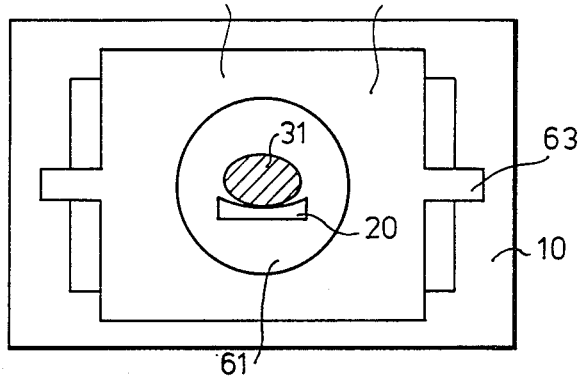
FIG. 4 shows a representation corresponding to FIG. 2, but with shielding cover plates.

However, in an effort to compensate even the minor leakage fields encountered at the end portions of the longitudinal opening 11, a further improvement of the invention according to FIG. 4 provides that the longitudinal opening 11 can be closed on one side or on both sides by a cover plate 60 leaving open only the areas where the coils 12, 12' and 13, 13' project from the opening. Marginal portions 62, 63 of the cover plate 60 extend a certain way into the end faces of the iron body 10 so that the field lines of any residual leakage field are closed safely. The cover plate 60 may be provided on one side or on both sides with an opening 61 of a size permitting the test object 31 to be introduced lying on the stretcher 20.

It is understood that the representation shown in FIG. 4 is of a diagrammatic nature only and that all hinges, or the like, for the cover plate 60 have been omitted for greater clarity.

We claim:
1. In a nuclear spin tomograph comprising:
   (a) a magnet system including main-field magnet-coil means for generating a substantially homogeneous magnetic field in a volume positioned with respect to the magnet coil means defining a tomographic-imaging volume;
   (b) a holder for a test object adapted to translatably position test portions of the test object in the tomographic-imaging volume;
   (c) gradient-field coil system means shaped and positioned relative to the main-field magnet-coil means for generating magnetic-gradient fields in the tomographic-imaging volume; and
   (d) radio-frequency irradiator/receiver means shaped and positioned relative to the main-field magnet-coil means for irradiating a radio-frequency field in the tomographic-imaging volume and receiving measuring signals from the tomographic-imaging volume, the improvement comprising a magnet system which includes:
   (a.1) a ferromagnetic yoke body surrounding an interior volume defining a test-object cavity, the test-object cavity extending in a direction to define a longitudinal direction and being dimensioned to receive the test object, the test-object cavity having openings at each of two substantially longitudinally opposing ends to define a cavity-access end openings in the yoke body, the cavity-access end openings including a test-object opening at one end dimensioned to receive the test object; and
   (a.2) main-field magnet-coil means shaped and positioned for generating a substantially homogene- ous magnetic field in a tomographic-imaging volume positioned generally centrally within the test-object cavity of the yoke body, the main-field magnet-coil means including at least two cavity-interior longitudinal-coil sections and at least one cavity-exterior transverse-closure section, each cavity-interior longitudinal-coil section of the main-field magnet-coil means extending substantially in the longitudinal direction through the test-object cavity of the yoke body from a first cavity-access end opening at a first end of the test-object cavity to a second cavity-access end opening at a second end of the test-object cavity opposing the first end of the test-object cavity, each cavity-exterior transverse-closure section of the main-field magnet-coil menas extending substantially externally of the test-object cavity in the yoke body generally transversely to the longitudinal direction and interconnecting ends of two cavity-interior longitudinal-coil sections located at one end of the test-object cavity.

2. The nuclear spin tomograph according to claim 1, in which the test-object cavity has a cross-sectional shape defined normal to the longitudinal direction which is generally rectangular, and the main-field magnet-coil means includes four corner cavity-interior longitudinal-coil sections, each of the four corner cavity-interior longitudinal-coil sections being positioned at one of the four corners defined by the rectangular cross-sectional shape of the test-object cavity.

3. The nuclear spin tomograph according to claim 2, in which the magnet system includes a field-correction shim in the form of a longitudinally-extending ferromagnetic element located in the test-object cavity for field-correction.

4. The nuclear spin tomograph according to claim 2 in which the magnet system includes a field-correction plate comprised of a soft-magnetic material located in an inwardly-facing wall area of the test-object cavity of the yoke body and field-correction-plate displacement means for displacing the field-correction plate in at least one direction substantially perpendicular to the longitudinal direction defined by the test-object cavity.

5. The nuclear spin tomograph according to claim 2, in which the magnet system includes a pair of cover plate comprised of a soft-magnetic material respectively positioned at longitudinally opposing ends of the yoke body to close partially the test-object cavity, spaces between the perimeter of the test-object cavity of the yoke body and the cover plates forming cavity-access end-openings through which main-field magnet-coil means sections pass, one cover plate having an opening passing centrally through it to define the test-object opening, outer perimeter portions of the cover plates overlapping perimeter areas of the yoke body adjacent the test-object cavity.

6. The nuclear spin tomograph according to claim 2 in which the longitudinal direction defined by the test-object cavity extends substantailly horizontally when the magnet system is in a horizontal rest position.

7. The nuclear spin tomograph according to claim 2 in which the longitudinal direction defined by the test-object cavity extends substantially vertically when the magnet system is in a horizontal rest position.

8. In a nuclear spin tomograph comprising:
(a) a magnet system including a main-field magnet-coil mens for generating a substantially homogeneous magnetic field in a volume positioned with respect to the magnet coil means defining a tomographic-imaging volume;
(b) a holder for a test object adapted to translatably position test portions of the test object in the tomographic-imaging volume;
(c) gradient-field coil system means shaped and positioned relative to the main-field magnet-coil means for generating magnetic-gradient fields in the tomographic-imaging volume; and
(d) radio-frequency irradiator/receiver means shaped and positioned relative to the main-field magnet-coil means for irradiating a radio-frequency field in the tomographic-imaging volume and receiving measuring signals from the tomographic-imaging volume, the improvement comprising a magnet system which includes:
(a.1) a ferromagnetic yoke body surrounding an interior volume defining a test-object cavity, the test-object cavity extending in a direction to define a longitudinal direction and being dimensioned to receive the test object, the test-object cavity having openings at each of two substantially longitudinally opposing ends to define cavity-access ends openings in the yoke body, the cavity-access end openings including a test-object opening at one end dimensioned to receive the test object;
(a.2) main-field magnet-coil means shaped and positioned for generating a substantially homogeneous magnetic field in a tomographic-imaging volume positioned generally centrally within the test-object cavity of the yoke body, the main-field magnet-coil means including at least two cavity-interior longitudinal-coil sections and at least one cavity-exterior transverse-closure section, each cavity-interior longitudnal-coil section of the main-field magnet-coil means extending substantially in the longitudinal direction through the test-object cavity of the yoke body from a first cavity-access end opening at a first end of the test-object cavity to a second cavity-access end opening at a second end of the test-object cavity opposing the first end of the test-object cavity, each cavity-exterior transverse-closure section of the main-field magnet-coil means extending substantially externally of the test-object cavity in the yoke body generally transversely to the longitudinal direction and interconnecting ends of two cavity-interior longitudinal-coil sections located at one end of the test-object cavity; and
(a.3) coil-section displacement means for displacing a cavity-interior longitudinal-coil section in the test-object cavity in a direction generally perpendicular to the longitudinal direction.

9. The nuclear spin tomograph according to claim 8, in which the test-object cavity has a cross-sectional shape defined normal to the longitudinal direction which is generally rectangular, and the main-field magnet-coil means includes four corner cavity-interior longitudinal-coil sections, each of the four corner cavity-interior longitudinal-coil sections being positioned at one of the four corners defined by the rectangular cross-sectional shape of the test-object cavity.

10. The nuclear spin tomograph according to claim 9, in which the magnet system includes a field-correction shim in the form of a longitudinally-extending ferromagnetic element located in the test-object cavity for field-correction.

11. The nuclear spin tomograph according to claim 9 in which the magnet system includes a field-correction plate comprised of a soft-magnetic material locate in an inwardly-facing wall area of the test-object cavity of the yoke body and field-correction-plate displacement means for displacing the field-correction plate in at least one direction substantially perpendicuar to the longitudinal direction defined by the test-object cavity.

12. The nuclear spin tomograph according to claim 9, in which the magnet system includes a pair of cover plates comprised of a soft-magnetic material respectively positioned at longitudinally opposing ends of the yoke body to close partially the test-object cavity, spaces between the perimeter of the test-object cavity of the yoke body and the cover plates forming cavity-access end-openings through which main-field magnet-coil means sections pass, one cover plate having an opening passing centrally through it to define the test-object opening, outer perimeter portions of the cover plates overlapping perimeter areas of the yoke body adjacent the test-object cavity.

13. The nuclear spin tomograph according to claim 9 in which the longitudinal direction defined by the test-object cavity extends substantially horizontally when the magnet system is in a horizontal rest position.

14. The nuclear spin tomograph according to claim 9 in which the longitudinal direction defined by the test-object cavity extends substantially vertically when the magnet system is in a horizonal rest position.

* * * * *